(12) United States Patent
Zandi et al.

(10) Patent No.: US 10,818,512 B2
(45) Date of Patent: Oct. 27, 2020

(54) PHOTO-ASSISTED CHEMICAL VAPOR ETCH FOR SELECTIVE REMOVAL OF RUTHENIUM

(71) Applicant: Tokyo Electron Limited, Tokyo (JP)

(72) Inventors: Omid Zandi, Austin, TX (US); Jacques Faguet, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/773,211

(22) Filed: Jan. 27, 2020

(65) Prior Publication Data
US 2020/0243346 A1   Jul. 30, 2020

Related U.S. Application Data

(60) Provisional application No. 62/797,610, filed on Jan. 28, 2019.

(51) Int. Cl.
*H01L 21/321* (2006.01)
*H01L 21/3213* (2006.01)

(52) U.S. Cl.
CPC .............. *H01L 21/32135* (2013.01)

(58) Field of Classification Search
None
See application file for complete search history.

(56) References Cited

U.S. PATENT DOCUMENTS

2009/0114619 A1\* 5/2009 Sotoaka ............ H01L 21/67086
216/48

\* cited by examiner

*Primary Examiner* — Roberts P Culbert

(57) ABSTRACT

Methods and systems herein enable selective removal of ruthenium (Ru) metal at high throughput, and without potentially damaging effects of plasma. Techniques include a photo-assisted chemical vapor etch (PCVE) method to selectively remove Ru metal as a volatile species. A substrate with ruthenium surfaces is positioned within a processing chamber. A photo-oxidizer is received in vapor form in the processing chamber. The photo-oxidizer is a species that generates reactive oxygen species in response to actinic radiation. Reactive oxygen species are then generated by irradiation of the photo-oxidizer, such as with ultraviolet radiation. The reactive oxygen species react with ruthenium surfaces causing the ruthenium surfaces to become oxidized. Oxidized ruthenium is then removed from the substrate, such as be vaporization.

20 Claims, 5 Drawing Sheets

PHOTO-ASSISTED CHEMICAL VAPOR ETCH FOR SELECTIVE REMOVAL OF RUTHENIUM

CROSS REFERENCE TO RELATED APPLICATIONS

The present application claims the benefit of U.S. Provisional Patent Application No. 62/797,610, filed on Jan. 28, 2019, entitled "Photo-assisted Chemical Vapor Etch Method for Selective Removal of Ruthenium," which is incorporated herein by reference in its entirety.

BACKGROUND OF THE INVENTION

This disclosure relates to semiconductor processing and micro fabrication techniques.

Fabrication of integrated circuits (IC) in the semiconductor industry typically employs a plasma to create and assist the surface chemistry that is necessary to remove material from, and deposit material onto, a substrate within a plasma processing chamber. In general, a plasma is formed within the plasma reactor under vacuum conditions by heating electrons to energies sufficient to sustain ionizing collisions with a supplied process gas. The heated electrons can have energy sufficient to sustain dissociative collisions. Therefore, a specific set of gases under predetermined conditions (e.g., chamber pressure, gas flow rate, etc.) are chosen to produce a population of charged species and/or chemically reactive species suitable to a particular process being performed within the chamber. For example, etching processes remove materials from the substrate and deposition processes add materials to the substrate.

One type of high-precision etching is atomic layer etching (ALE). ALE is typically designed as a self-limiting etch technique to systematically remove thin layers of a material from a substrate. Such etching can be executed by exposing a substrate to a plasma that may be transitioned between an adsorption state and a desorption state. Such thin layers can include monolayers or layers of material having a thickness of an atom or molecule. One object of ALE is to precisely remove an amount of material without damaging underlying layers.

SUMMARY

As feature sizes of microelectronic devices continue to shrink, processes with atomic level control are needed to fabricate complex device components. One well-known example is etching polycrystalline metals as part of metallization processes. With such metal etches, nanoscale uniformity is crucial to minimize device failure. Conventional etch processes often lead to undesirable surface roughening and etch non-uniformity due to fundamental nature of the process chemistry. Additionally, as new materials are introduced to replace conventional materials, suitable processes need to be developed that meet the process integration criteria.

One way to achieve nanoscale uniformity is to use self-limiting surface reactions such as in atomic layer etching. In ALE, material to be etched is sequentially exposed to alternating reactants in which the first reactant modifies a surface of the material to form a modified layer in a self-limiting reaction. A second reactant then removes the modified layer. Although ALE can achieve nanoscale uniformity, ALE is a time consuming process that reduces wafer throughput. Additionally, not all materials can be etched by ALE due to limitation in reactants and process availability.

Techniques herein, however, enable selective removal of ruthenium (Ru) metal at high throughput, and without potentially damaging effects of plasma. Techniques include a photo-assisted chemical vapor etch (PCVE) method to selectively remove Ru metal as a volatile species. Ru metal is a promising material to be used in the back-end-of-line (BEOL) IC (integrated circuit) metallization due to better resistivity scaling and electromigration properties.

One embodiment herein includes a method of etching a substrate. A substrate is positioned on a substrate holder within a processing chamber of a processing apparatus. The substrate has ruthenium surfaces and can also have non-ruthenium surfaces. A photo-oxidizer is received in vapor form in the processing chamber. The photo-oxidizer is a species that generates reactive oxygen species in response to actinic radiation. Reactive oxygen species are then generated by irradiation of the photo-oxidizer. The reactive oxygen species react with ruthenium surfaces causing the ruthenium surfaces to become oxidized. This results in a layer of oxidized ruthenium. Oxidized ruthenium is then removed from the substrate, such as by vaporization. Vaporized ruthenium ($RuO_4$) can then be removed from the processing chamber.

Another embodiment includes a method of etching a substrate. A substrate is positioned on a substrate holder within a processing chamber of a processing apparatus. The substrate has a ruthenium surface. A photo-oxidizer is caused to be adsorbed on the ruthenium surface. The photo-oxidizer is a species that generates reactive oxygen species in response to actinic radiation. A reactive oxygen species is generated by irradiation of the adsorbed photo-oxidizer. The reactive oxygen species causes the ruthenium surfaces to be oxidized. Oxidized ruthenium is then removed from the substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Ruthenium (Ru) is a comparatively hard metal that is considered very chemically and mechanically stable. Conventional processes to etch Ru use either energetic ions, like in plasma ALE, or highly oxidizing liquid chemicals. Both plasma-based etching and liquid-based techniques of etching Ru, however, are undesirable. Plasma ALE is undesirable because plasma ALE results in surface roughening and damage to a surface being etched as well as damage to other device components. Conventional wet etch processes are undesirable because of no control over etch kinetics. For example, wet etching results in variable etch rates at grain boundaries. Moreover, defect sites lead to pitting and surface roughening during the etch process.

Embodiments herein include a photo-assisted chemical vapor etch (PCVE) method to selectively remove ruthenium metal (Ru)—or ruthenium(IV) oxide ($RuO_2$)—by way of gas-phase removal. Embodiments herein focus on etching of Ru, but etching of $RuO_2$ is also enabled with techniques herein. FIG. 1 illustrates a gas phase removal system that can be used for embodiments herein. Ruthenium etching herein is based on transient reactions between in situ generated reactive radicals in gas phase (and/or adsorbed on the Ru surface), and Ru metal to form volatile etch products. The reactive radicals can be photo-chemically, chemically, or thermally generated in gas phase. A particular amount of material etched is controlled by several factors including reactant pulse time, illumination time, and lifetime of generated radicals. Such radicals are generally transient. Once photo-generated radicals are consumed or quenched, a corresponding etch event stops or slows. By controlling reactant pulse time coupled with a fundamentally short lifetime of the radicals, a quasi, self-limiting etching of Ru is achieved. Short lived radicals with microsecond lifetime allows uniform etching by minimizing diffusion-controlled preferential etch reactions at the grain boundaries and defect sites. Moreover, unlike ALE, processes here can be embodied as a single step (i.e. there is only one reactant involved) and thus can achieve significantly faster etch rates. Throughput is also improved because gas-phase etching can be executed in batches unlike ALE.

Figure 1A:
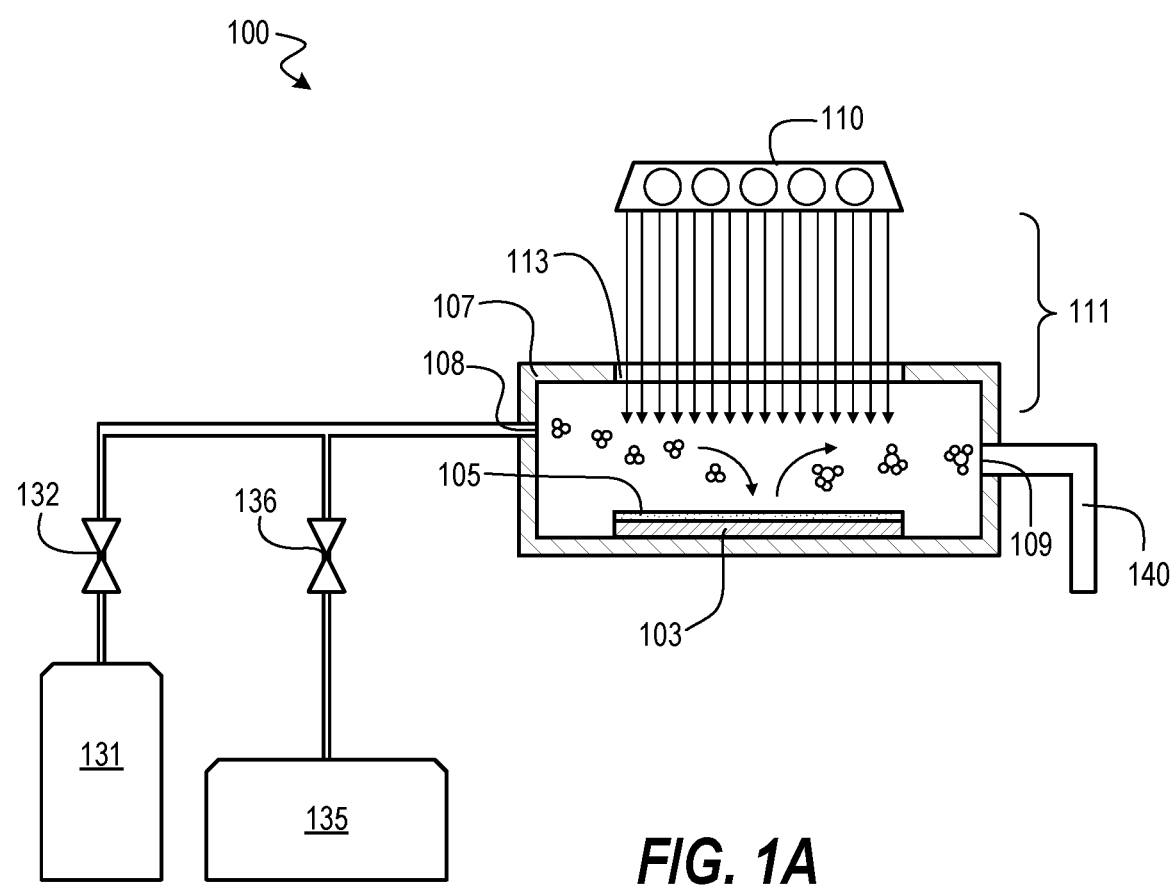
FIG. 1A is a cross-sectional schematic view of a system configured to perform embodiments disclosed herein.

Referring now to FIG. 1A, system 100 can be used to vapor etch ruthenium metal. A processing chamber 107 is provided. Processing chamber 107 is configured and sized sufficient to receive and hold one or more substrates (wafers) to be processed. These substrates can include ruthenium to be etched. The processing chamber 107 includes a substrate holder 103 for receiving substrate 105. Substrate holder 103 can include a heater for heating substrate 105. System 100 includes light source 110 for activating reactants. Light source 110 can provide, for example, ultraviolet and/or infrared light into the chamber and/or directed onto the substrate 105. The processing chamber 107 includes an inlet 108 for receiving one or more process gases. An outlet 109 can be connected to vacuum exhaust 140. Vacuum exhaust 140 can also be used to reduce pressure in the processing chamber 107. The system includes gas source 131, connected to the inlet 108. A valve 132 can regulate flow of process gas or process gasses from gas source 131. Gas source 131 can be, for example a hydrogen peroxide source. The system includes gas source 135, connected to the inlet 108. A valve 136 can regulate flow of process gas or process gasses from gas source 135. Gas source 135 can be, for example an ozone generator. Other sources of reactive species can be included in these gas sources as well as carrier gases. Additional gas sources can be added to feed into processing chamber 107.

Processing chamber 107 can include window 113 (or other opening) for radiation 111 to strike photo-oxidizers flowed into the processing chamber 107. Embodiments include using photo-oxidizers such as hydrogen peroxide, ozone, oxygen, or a mixture thereof, with or without added water, to generate reactive oxygen species that drive Ru etch as volatile $RuO_4$ species, which can then be purged from a reaction chamber. $RuO_4$ is volatile at low temperature with a melting point of 25° C., a boiling point of 91° C., and a vapor pressure of 3.6-11.2 torr at 27° C. This process is intrinsically selective as Ru is the only material forming volatile products. Alternative chemistries include, but are not limited to, hydroxyl radicals generated by photolysis of other peroxide species, chlorine radicals generated by photolysis of $Cl_2$, hypochlorous acid, oxalyl chloride or vinyl chloride species, and singlet oxygen generated chemically, thermally, or photonically using a photosensitizer dye. Example reaction formulas include:

Figure 1B:
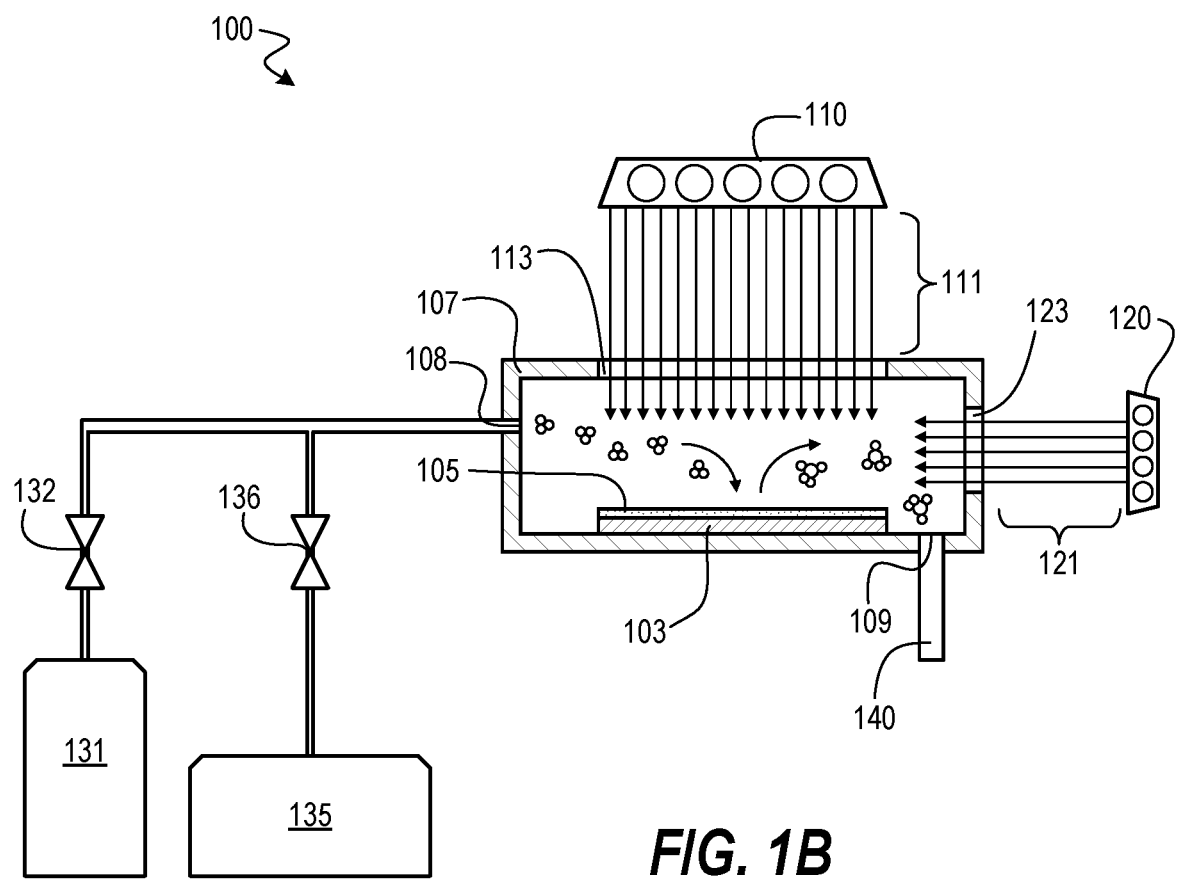
FIG. 1B is a cross-sectional schematic view of a system configured to perform embodiments disclosed herein.

FIG. 1B is an alternative system configuration that enables irradiation of a photo-oxidizer from a light source 120 that is positioned on a side of the process chamber 107. In this embodiment, radiation 121 enters via window 123 (or opening) and travels essentially parallel to a working surface of the substrate. Radiation 121 thus strikes photo-oxidizers within the chamber without striking a working surface of substrate 105. Having radiation enter from a side location can be beneficial when etching ruthenium from particular substrates. For example, if a given substrate has a low-k dielectric layer that could be damaged by UV light, then using side-sourced irradiation can prevent damage to the substrate. If another given substrate has material stacks that may not be affected by UV light, then either top or side irradiation can be selected. Note that embodiments herein can use radiation directed perpendicular to the substrate, radiation directed parallel to the substrate, or a combination of both light sources.

Etch processes herein operate by introducing one or more photo-oxidizers into a processing chamber and then exposing photo-oxidizers to UV light to generate reactive radicals (HO. or 1O and $1O_2$). Radicals are generated near surfaces of Ru to react with uncovered/exposed Ru surfaces as an oxidation reaction. Oxidation of Ru results in $RuO_4$. Oxidized Ru is then evaporated and removed using a carrier gas.

Figure 2A:
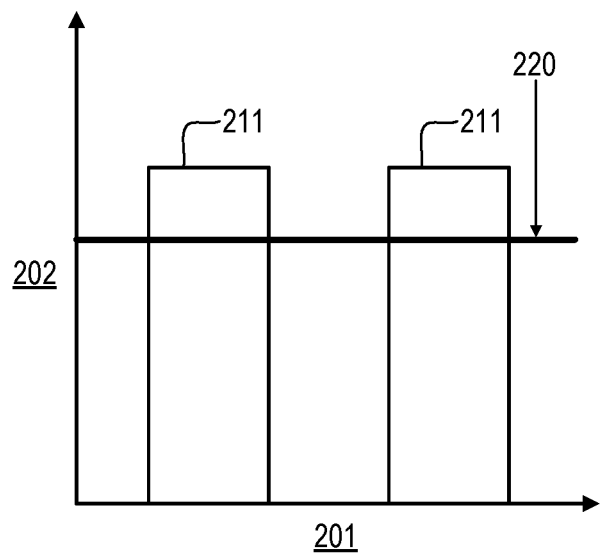
FIG. 2A is a diagram illustrating a process scheme of radiation and pressure according to embodiments disclosed herein.
Figure 2B:
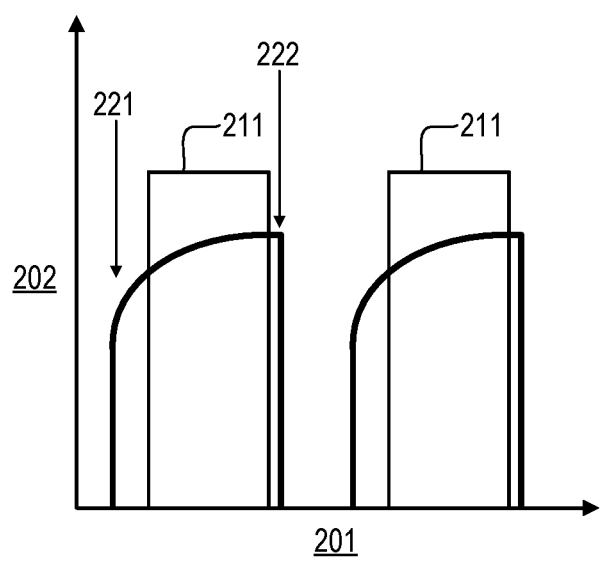
FIG. 2B is a diagram illustrating a process scheme of radiation and pressure according to embodiments disclosed herein.

Removal of $RuO_4$ can optionally and selectively happen in concert with the oxidation reaction or occur in a separate step depending on a particular operating temperature and pressure used. FIGS. 2A-2F include graphs illustrating various photo-assisted Ru etch modes. Time 201 is shown on the x-axis, while pressure and light intensity 202 are shown on the y-axis. If a particular etch reaction is executed at a high temperature, then $RuO_4$ is volatile and therefore will leave the surface as is oxidizes (FIGS. 2A-2B). In FIG. 2A, a reactant (photo-oxidizer) is introduced to the etch reactor (process chamber) at a constant flow and reactant pressure (220). The reactant is illuminated with UV light pulse 211 to generate reactive etch species. In FIG. 2B, a reactant is pulsed (221) sequentially into the reactor, and UV light pulse 211 is synchronized with the reactant pulse 221. The reactor is then purged (222) to remove remaining reactants as well as etch products. This reactant pulse and UV light pulse pattern can then continue until completing an etch process. Completion of an etch process can be removal of a predetermined amount of Ru or removal of all uncovered Ru.

Figure 2C:
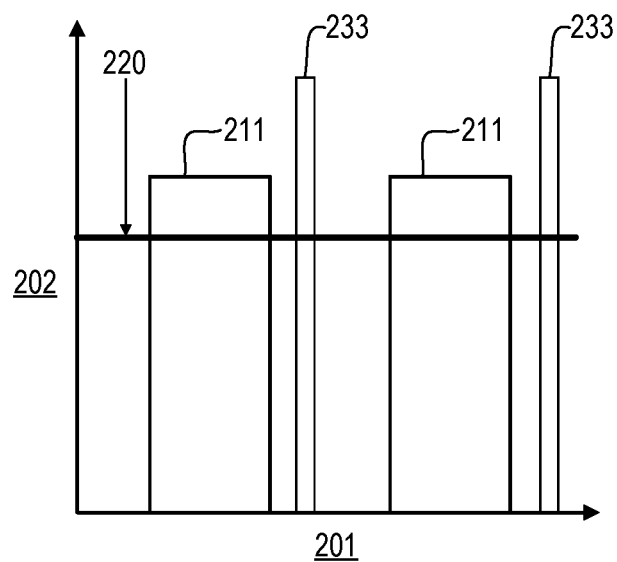
FIG. 2C is a diagram illustrating a process scheme of radiation and pressure according to embodiments disclosed herein.
Figure 2D:
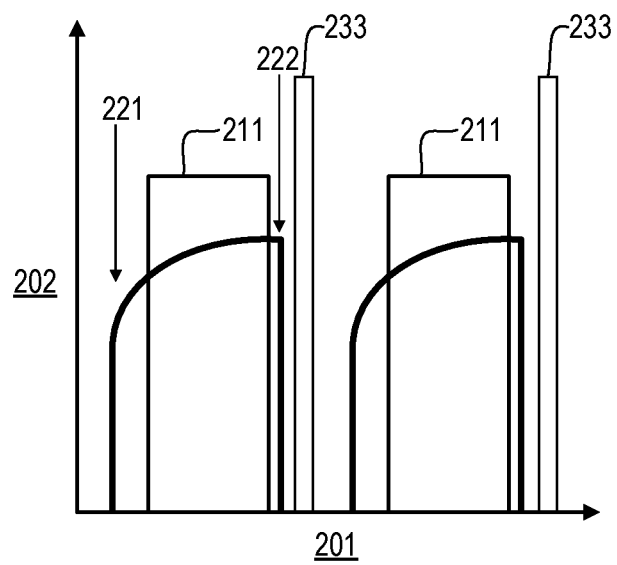
FIG. 2D is a diagram illustrating a process scheme of radiation and pressure according to embodiments disclosed herein.

Alternatively, the reactor temperature can be set low enough that $RuO_4$ forms a surface oxide layer. This surface oxide layer can be further vaporized using an infrared (IR) light pulse 233 as shown in FIGS. 2C-2D. At a sufficiently low temperature, etch products are not volatile. FIG. 2C is a modification of FIG. 2A. In FIG. 2C, an IR light pulse 233 (which can be a laser pulse) can then be used to evaporate oxidized Ru to remove the surface modified $RuO_4$ layer. In FIG. 2D (similar to FIG. 2B), the reactant pulse (221) and UV light pulse 211 are executed simultaneously and at a low temperature, such as 0° C. Oxidation of the surface layer is then followed by an IR laser pulse to remove the $RuO_4$ layer.

Photo-assisted etch processes herein can be executed at room temperature given the volatility of $RuO_4$ species. Additionally, unlike methods such as plasma ALE there are no energetic ions involved that could induce surface roughening and damage to other device components.

Figure 2E:
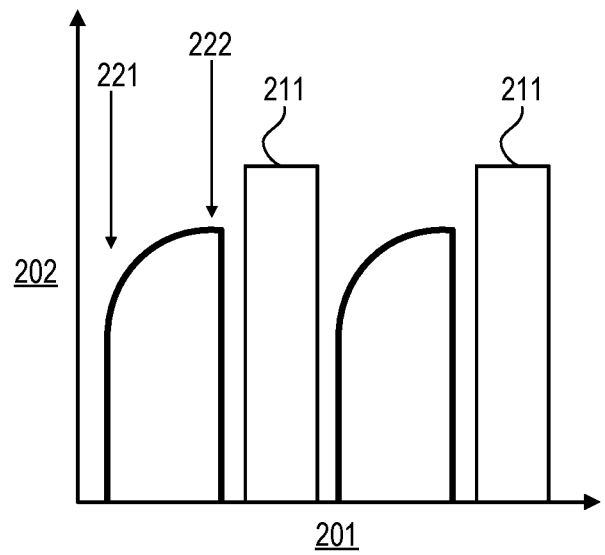
FIG. 2E is a diagram illustrating a process scheme of radiation and pressure according to embodiments disclosed herein.
Figure 2F:
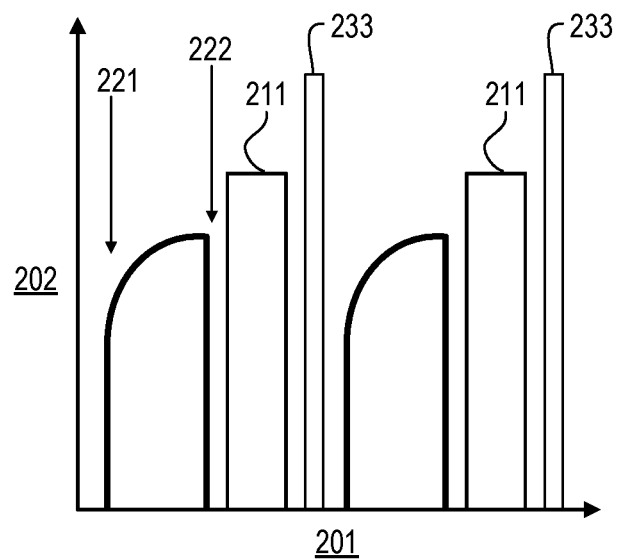
FIG. 2F is a diagram illustrating a process scheme of radiation and pressure according to embodiments disclosed herein.

As can be appreciated, other processing schemes are contemplated herein, with many combinations of processing parameters. In FIG. 2E, a reactant is pulsed into the chamber and is condensed or adsorbed on the substrate surface. The chamber is then purged to remove the excess photo-oxidizer followed by a pulse of UV light to activate the surface photo-oxidation process, which steps can then be repeated. In FIG. 2F, an etch process can be run at low temperature where the modified layer in FIG. 2F is removed with an IR light pulse 233.

One embodiment herein is a method of etching a substrate. A substrate is positioned on a substrate holder within a processing chamber of a processing apparatus. The substrate holder, for example, can be a chuck within an etch chamber. Alternatively the processing apparatus can be configured for processing a batch of wafers. The substrate has ruthenium surfaces, or ruthenium oxide surfaces, and can also include non-ruthenium surfaces. For example, the substrate can be a patterned semiconductor wafer in which electronic devices are being micro-fabricated. Thus, the substrate can have a depositions of ruthenium to be partially removed or fully removed. Ruthenium and $RuO_2$ can be used for conductive applications or as a catalyst. $RuO_2$ can also be a byproduct of certain microfabrication processes and can coat chamber walls. Accordingly, techniques herein can also be used as a cleaning process to clean ruthenium or ruthenium oxide residuals from chamber walls or other surfaces.

A photo-oxidizer is received in vapor form in the processing chamber. The photo-oxidizer is a species that generates reactive oxygen species in response to actinic radiation, such as UV light. For example, a gas-phase photo-oxidizer such as hydrogen peroxide, ozone, et cetera, is flowed into the processing chamber and directed toward the substrate, to be in contact with a working surface of the substrate. Reactive oxygen species are then generated by irradiation of the photo-oxidizer within the processing chamber. For example, UV light illuminates the photo-oxidizer as the photo-oxidizer flows toward the ruthenium surface or while the photo-oxidizer is at or proximate the ruthenium surface. The reactive oxygen species in contact with the ruthenium surfaces react causing the ruthenium surfaces to be oxidized. This results in a layer of oxidized ruthenium, which is then removed from the substrate. Oxidized ruthenium that has been vaporized can then be removed from the processing chamber such as via vacuum purge. This vaporized ruthenium is in the form $RuO_4$, which is a volatile form of ruthenium.

The substrate can be heated to a predetermined reaction temperature to assist or cause reactions. For example, a temperature of the substrate can adjusted to result in an oxidized layer of ruthenium on the ruthenium surfaces. A specific temperature of the substrate can also be set to cause oxidized ruthenium to vaporize.

Various light treatments can be used. The oxidized layer of ruthenium can be removed by using infrared radiation to cause photothermal evaporation. Infrared light can be pulsed or steady. UV light can be used to irradiate the photo-oxidizer species to create reactive oxygen species. UV light can steady, pulsed, and/or patterned, and can be pulsed with a pulse of photo-oxidizers. A given light dosage can be based on an amount of reactive oxygen species to be generated, which can be based on a particular thickness of ruthenium to be removed. Moreover, the photo-oxidizer itself can be pulsed into the processing chamber. UV light can be pulsed with pulsed photo-oxidizer, or pulses can be alternated. An amount or intensity of pulsed light can be based on a predetermined amount of reactive oxygen species to be generated. An optional purge step can be executed after irradiation/oxidation and/or vaporization. A given oxidation and vaporization step can adjusted to remove a particular amount of ruthenium. Steps of oxidation and vaporization can then be cycled a particular number of times to result in a specific total thickness of ruthenium being removed.

Projected UV light can be varied in intensity and/or dose by coordinate location on the substrate. In other words, patterned light can be projected on the working surface of the substrate to generate more or less reactive oxygen species at point locations on the substrate. For example, if reactions at edges of a substrate typically happen slower than a center portion of the substrate, then more reactants can be created at edge portions of the substrate. Activating light can be projected using a scanning beam with varied dwell times per coordinate, or can be projected across the substrate in one exposure using digital light projection or a photomask. A given dose of light at a particular location can be based on variations in thickness of ruthenium to be removed, or device characteristics at the particular locations. Light can also be projected parallel to the working surface (projected from the side) to avoid UV exposure to any material on the substrate that might be sensitive to UV light.

In another embodiment, a photo-oxidizer can be caused to be adsorbed to ruthenium surfaces on the substrate. This can be executed by condensation, physisorption, chemisorption, and so forth. The photo-oxidizer can also be selectively adsorbed to ruthenium surfaces (or $RuO_2$ surfaces) and not to non-ruthenium surfaces. Reactive oxygen species are then generated by irradiating the photo-oxidizer adsorbed on the ruthenium surface, which causes the ruthenium surface to be oxidized. Oxidized ruthenium can then be removed as described above with various combinations of heated chuck, heated chamber, IR pulsing, et cetera.

Although example techniques herein have primarily focused on etching of ruthenium on the micro-fabrication scale, this is non-limiting. Etching on a macro scale can also be executed, such as for mirror surfaces, electroplating, and so forth.

Techniques herein for Ru etching provide many benefits. One benefit is control over etch behavior. Using photo-assisted, point-of-use generation of short-lived etchants allows control over etch rate to control etching at a nanoscale and within wafer uniformity. Without long-lasting radicals, an active reaction time is essentially limited to a duration of light exposure. Etching with short-lived etchants with microsecond lifetimes limits reactant diffusion through grain boundaries and defect sites thus minimizing surface roughness during the etch process. In addition to time control, spatial control is also provided herein. The light source can be a projection source with spatial adjustment of intensity, such as a pixelated projection or raster projection. For example spatial variation in etch amount can be corrected by adjusting the light intensity by coordinate location on the substrate to result in more or less etching at given point locations. This can help compensate for areas having more or less Ru to be etched.

Processes herein provide precise etch selectivity. In many substrates, the uncovered or exposed materials on a substrate surface include Ru plus other materials. The other materials can be selected so that etch processes herein essentially only etch Ru because Ru is the only volatile species being generated during the process. With some non-ruthenium metals and with some dielectrics there can be some etching of non-ruthenium materials. Nevertheless, with many conventional materials used at the Ru metallization stage there is essentially no etching from the reactive oxygen species at the proposed process temperature and pressures. An example of process temperature and pressure for selective Ru etching reacting at ambient temperature and a pressure of 1 torr. A particular process pressure used in a given reaction can vary based on desired etch rate and tool configurations. Typical process temperatures range from 0-400° C., though other process temperatures can be used. Using process temperatures below 0° C. can be beneficial given the favorable energetics of $RuO_4$ formation upon reaction with HO. At such low temperatures, however, $RuO_4$ vapor pressure is low and thus $RuO_4$ vapor can form a surface layer that can be volatilized using photothermal means such as IR illumination.

Techniques herein provide a contamination free process. Processes herein can be limited to use of inorganic oxidizers (for example, carbon-free $H_2O_2$ or $O_3$) and light with the product being volatile $RuO_4$ that leaves the etch chamber. Accordingly, there is no risk of carbon and metal contamination. Techniques herein also provide a plasma-free and low temperature solution. This etch process can be performed at room temperature given the volatility of $RuO_4$ species. Additionally, unlike methods such as plasma ALE there are no energetics ions involved that could induce surface roughening and damage to other device components.

Techniques herein are also highly selective. Ruthenium can be removed as volatile $RuO_4$ without removing other materials. Etching of poly crystalline ruthenium is uniform. Using short-lived and highly reactive radicals minimizes preferential oxidative removal on more reactive surface sites. Etching herein can be faster than ALE in part because processes herein can use a single reactant and can be reacted in a continuous mode.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method of etching a substrate, the method comprising:
   positioning a substrate on a substrate holder within a processing chamber of a processing apparatus, the substrate having ruthenium surfaces and non-ruthenium surfaces;

receiving a photo-oxidizer in vapor form in the processing chamber, the photo-oxidizer being a species that generates reactive oxygen species in response to actinic radiation;

generating reactive oxygen species by irradiating the photo-oxidizer within the processing chamber, the reactive oxygen species reacting with ruthenium surfaces causing the ruthenium surfaces to become oxidized resulting in a layer of oxidized ruthenium as $RuO_4$; and removing the layer of oxidized ruthenium from the substrate.

2. The method of claim 1, wherein the photo-oxidizer is directed to be in contact with a working surface of the substrate; and wherein the photo-oxidizer is selected from the group consisting of hydrogen peroxide, ozone, and oxygen.

3. The method of claim 1, further comprising heating the substrate to a predetermined reaction temperature using the substrate holder to heat the substrate.

4. The method of claim 3, wherein the predetermined reaction temperature causes the layer of oxidized ruthenium to vaporize.

5. The method of claim 3, wherein the predetermined reaction temperature results in the oxidized layer of ruthenium on the ruthenium surfaces.

6. The method of claim 5, further comprising removing the oxidized layer of ruthenium from the ruthenium surfaces by using infrared radiation causing evaporation of oxidized ruthenium from the oxidized layer of ruthenium.

7. The method of claim 1, wherein generating reactive oxygen species by irradiating the photo-oxidizer includes pulsing ultraviolet light based on a predetermined amount of reactive oxygen species to be generated.

8. The method of claim 7, further comprising pulsing infrared light causing evaporation of oxidized ruthenium, wherein pulsing of ultraviolet light is alternated with pulsing of infrared light.

9. The method of claim 1, wherein generating reactive oxygen species by irradiating the photo-oxidizer includes projecting ultraviolet light and varying an intensity of the projected ultraviolet light by coordinate location on the substrate.

10. The method of claim 1, wherein generating reactive oxygen species by irradiating the photo-oxidizer includes projecting ultraviolet light and varying a dose of the projected ultraviolet light by coordinate location of the substrate.

11. The method of claim 10, further comprising identifying an initial thickness of ruthenium surfaces by coordinate location; and wherein the dose of projected ultraviolet light projected at each coordinate location is based on an amount of ruthenium to be removed.

12. The method of claim 1, wherein generating reactive oxygen species by irradiating the photo-oxidizer includes projecting ultraviolet light parallel to a working surface of the substrate.

13. The method of claim 1, wherein receiving the photo-oxidizer in vapor form includes pulsing the photo-oxidizer into the processing chamber.

14. The method of claim 13, wherein ultraviolet light is pulsed with the photo-oxidizer.

15. A method of etching a substrate, the method comprising:

positioning a substrate on a substrate holder within a processing chamber of a processing apparatus, the substrate having a ruthenium surface;

causing a photo-oxidizer to be adsorbed on the ruthenium surface, the photo-oxidizer being a species that generates reactive oxygen species in response to actinic radiation;

generating reactive oxygen species by irradiating the photo-oxidizer adsorbed on the ruthenium surface, the reactive oxygen species causing the ruthenium surface to be oxidized resulting in a layer of oxidized ruthenium; and removing the layer of oxidized ruthenium from the substrate.

16. The method of claim 15, further comprising heating the substrate to a predetermined reaction temperature using the substrate holder causing the layer of oxidized ruthenium to vaporize.

17. The method of claim 15, further comprising removing the layer of oxidized ruthenium from the ruthenium surface by using infrared radiation causing evaporation of oxidized ruthenium from the ruthenium surface.

18. The method of claim 17, further comprising pulsing infrared light causing evaporation of oxidized ruthenium, wherein pulsing of ultraviolet light is alternated with pulsing of infrared light.

19. The method of claim 15, wherein the substrate includes both ruthenium surfaces and non-ruthenium surfaces, and wherein causing the photo-oxidizer to be adsorbed to the ruthenium surface includes causing selective adsorption of the photo-oxidizer to ruthenium surfaces without the photo-oxidizer adsorbing to the non-ruthenium surfaces.

20. A method of etching a substrate, the method comprising:

receiving a substrate to be processed within a processing chamber of a processing apparatus, the substrate having a ruthenium oxide ($RuO_2$) surface;

directing a photo-oxidizer in vapor form to the $RuO_2$ surface, the photo-oxidizer being a species that generates reactive oxygen species in response to actinic radiation;

generating reactive oxygen species by irradiation of the photo-oxidizer with ultraviolet radiation while the photo-oxidizer is proximate the $RuO_2$ surface, the reactive oxygen species contacting the $RuO_2$ surface causing the $RuO_2$ surface to be further oxidized resulting in a layer of $RuO_4$; and removing the layer of $RuO_4$ by vaporization of $RuO_4$, and removing vaporized $RuO_4$ from the processing chamber.

* * * * *